United States Patent [19]
Miyaji et al.

[11] Patent Number: 5,282,173
[45] Date of Patent: Jan. 25, 1994

[54] SEMICONDUCTOR MEMORY DEVICE WITH HIGH SPEED TRANSMISSION OF ADDRESS SIGNALS BETWEEN A PREDECODER AND A MAIN DECODER

[75] Inventors: Fumio Miyaji; Takeshi Matsushita, both of Kanagawa, Japan

[73] Assignee: Sony Corporation, Tokyo, Japan

[21] Appl. No.: 877,923

[22] Filed: May 4, 1992

[30] Foreign Application Priority Data
May 7, 1991 [JP] Japan .................. 3-041398
May 7, 1991 [JP] Japan .................. 3-132084[U]

[51] Int. Cl.$^5$ ................................ G11C 8/00
[52] U.S. Cl. ................ 365/230.03; 307/443; 307/475
[58] Field of Search .......... 365/230.03; 307/475, 307/443, 198, 227

[56] References Cited
U.S. PATENT DOCUMENTS

| | | | |
|---|---|---|---|
| 4,495,626 | 1/1985 | Brunin et al. | 307/475 |
| 5,045,730 | 9/1991 | Cooperman et al. | 307/443 |
| 5,111,080 | 5/1992 | Mizukami et al. | 307/475 |
| 5,227,677 | 7/1993 | Furman | 307/443 |

Primary Examiner—Joseph A. Popek
Assistant Examiner—Christopher Glembocki
Attorney, Agent, or Firm—Hill, Steadman & Simpson

[57] ABSTRACT

A semiconductor memory device including an address decode signal transmission circuit comprising address buffers; a predecoder; address buses provided before a main decode; a transmission circuit for outputting predecoded signals to the address buses while limiting amplitude thereof; and a receiving circuit provided before the main decoder for differentially amplifying signals from the address buses, wherein the memory cell array is divided into a plural number of sub-blocks and power can be selectively supplied to at least one of the sub-blocks.

1 Claim, 7 Drawing Sheets

SEMICONDUCTOR MEMORY DEVICE WITH HIGH SPEED TRANSMISSION OF ADDRESS SIGNALS BETWEEN A PREDECODER AND A MAIN DECODER

BACKGROUND OF THE INVENTION

1. Field of the Invention

The present invention relates to a semiconductor memory device capable of realizing the high-speed transmission of predecoded address signals, and of reducing power consumption using only part of its large-capacity memory.

2. Description of the Prior Art

Figure 1:
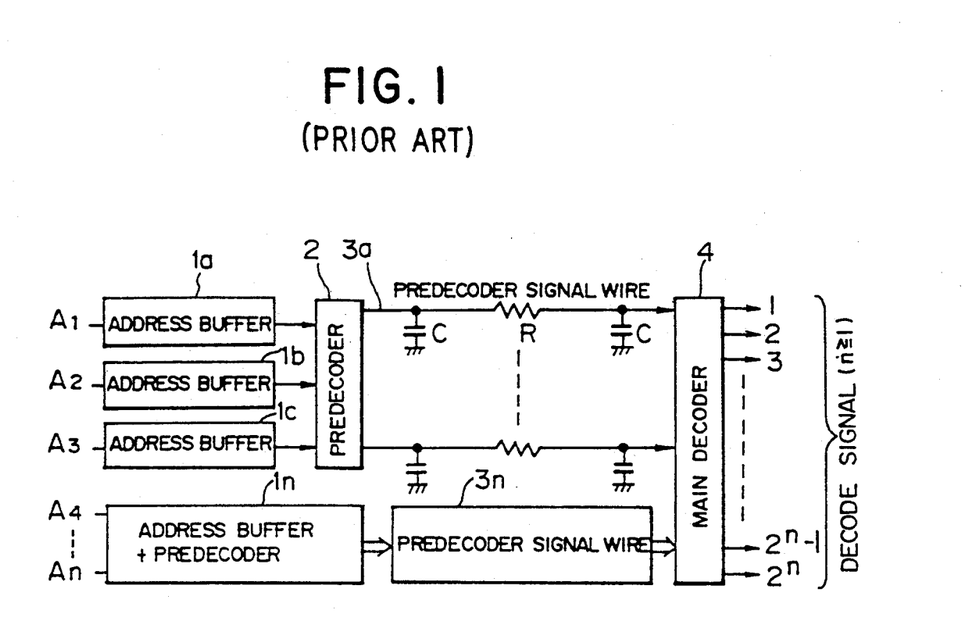
FIG. 1 is a construction view showing an address bus signal system in a conventional semiconductor memory device.

It is well known that a CMOS memory has a construction shown in FIG. 1, wherein address signals $A_1$ to $A_n$ are supplied through address buffers $1a$ to $1n$ to a predecoder 2 and are predecoded.

The predecoded signals are then transmitted through predecoded signal lines $3a$ to $3n$ to a main decoder 4.

As shown in FIG. 1, the predecoded signal lines $3a$ to $3n$ have parasitic wire capacities C. The capacities C become larger with the increased length of the predecoded signal lines $3a$ to $3n$. As the chips become larger in size along with increase in the memory capacity, the capacities C become larger.

In transmitting signals through the predecoded signal lines $3a$ to $3n$ with the capacities C, the capacities C need to be charged and discharged. Accordingly, it takes a long time to discharge and discharge the increased wire capacities C. Therefore, with the longer predecoded signal lines $3a$ to $3n$, a delay time due to the capacities C is not ineligible, thus preventing address signals from being transmitted in high-speed.

Along with increase in the memory capacity, memory areas in the chip tend to be partly but not fully utilized.

However, in using only part of memory areas, all of its memory areas have been activated. Therefore, a stand-by current consumed by a semiconductor memory device is constant irrespective of memory bits to be used. As a result, even when only a limited number of bits are used, a large amount of stand-by current have been used in the same manner as in using all its memory areas.

Thus, in the case that a large-capacity memory device is contained in a system using large memory areas in the future but only part of its memory areas in the beginning, there causes such inconvenience that a large stand-by current is consumed even when the use of its memory areas is limited. Particularly, in a battery-operation system, the continuous operative time is shortened with the large current consumption, and consequently it is desired to reduce the current consumption. Therefore, in the case that a large-capacity semiconductor memory devices are contained in the system requiring only part of memory areas, it becomes advantageous that a large stand-by current is consumed.

SUMMARY OF THE INVENTION

It is therefore an object of the present invention to provide a semiconductor memory device capable of reducing a delay time due to wire capacities, realizing the high-speed transmission of address signals between a predecoder and a main decoder, and reducing the current consumption in correspondence to the memory areas actually used within its relatively larger capacity memory.

To achieve the above object, the present invention provides a semiconductor memory device comprising a transmission circuit for transmitting predecoded signals output from a predecoder with the limited amplitude, and a receiving circuit having a differential amplifier for amplifying the predecoded signals with the limited amplitude to restore them to the predecoded signals with the specified amplitude, thereby effecting signal transmission between the predecoder and the main decoder in a low range of amplitude.

The above semiconductor memory device furthermore comprises a memory cell array dividable into a desired number of unit memory cell arrays, a power supply circuit for individually effecting the power supply for activating the plural number of the divided unit memory cell arrays, and a power supply destination allocation circuit for allocating a stand-by current output from the power supply circuit and activating a desired number of blocks among the unit memory cell arrays in correspondence to a memory capacity to be used.

In a first aspect of the present invention, there is provided a transmission circuit and a receiving circuit between a predecoder and a main decoder for limiting the amplitude of predecoded signals output from the predecoder by the above transmission circuit. Thus, signal transmission between the predecoder and the main decoder is effected in a low range of amplitude, which prevents signal transmission from being reduced due to the wire capacities between the predecoder and main decoder, and which improves the accuracy in detecting signals transmitted with a low amplitude by receiving the transmitted signals with a differential amplifier.

In a second aspect of the present invention, the large-capacity memory areas in a semiconductor memory device are divided into a plural number of blocks to which a power supply can be individually effected, thus supplying power only to the memory blocks to be used. Accordingly, in the memory areas not to be used, a stand-by current can be prevented from being consumed. Namely, when a large-capacity semiconductor memory device is contained in a system requiring larger memory areas in the future but only limited memory areas in the beginning, power can be prevented from being consumed.

BRIEF DESCRIPTION OF THE DRAWINGS

The above and other objects, features and advantages of the present invention will be more apparent from the following description taken in connection with the accompanying drawings, in which.

DETAILED DESCRIPTION OF THE PREFERRED EMBODIMENTS

Hereinafter the exemplary embodiments of the present invention will be described in detail with respect to the accompanying drawings.

Figure 2:
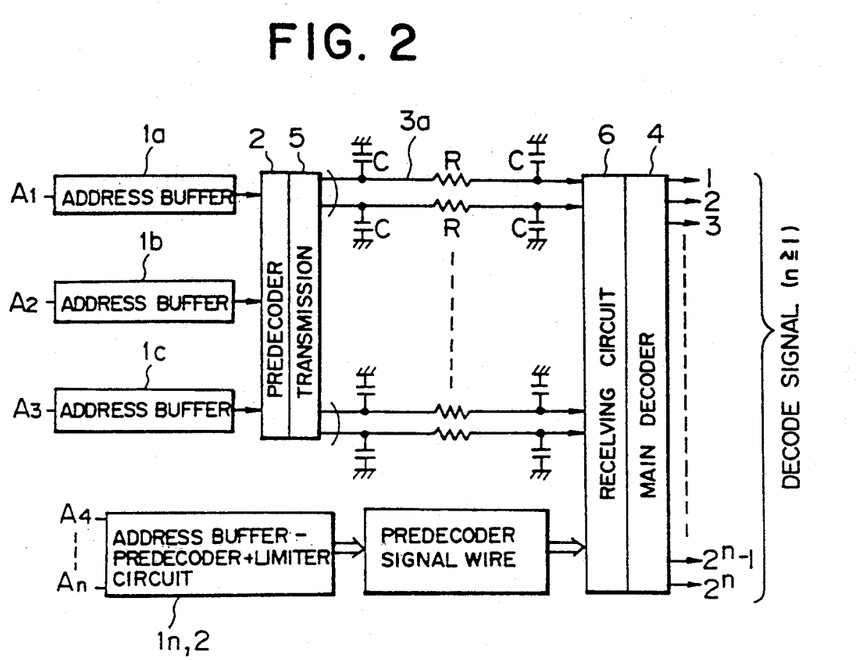
FIG. 2 is a construction view showing a semiconductor memory device of the present invention.

Referring to now FIG. 2, a semiconductor memory device according to the present invention comprises a transmission circuit 5 provided immediately after a predecoder 4. With the transmission circuit 5 and the receiving circuit 6, the signal transmission is effected between the predecoder 2 and the main decoder 4.

Figure 3:
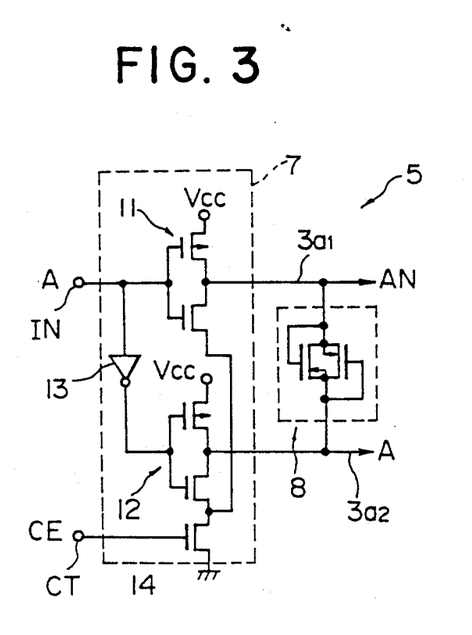
FIG. 3 is a signal transmission circuit according to the present invention.

The transmission circuit 5 converts predecoded signals output from the predecoder 2 in a single mode into dual signals and limits their amplitude to, for example, 1/10. For this purpose, there is used a transmission circuit 5 comprising a single-dual converter 7 and a signal amplitude limiter 8, as shown in FIG. 3.

The single-dual converter 7 has a primary CMOS circuit 11 and a secondary CMOS circuit 12 connected in parallel to each other for directly feeding predecoded signals A from the input terminal 1N to the primary CMOS circuit 11 and for feeding the predecoded signals A to the secondary CMOS circuit 12 through an invertor 13.

A switching NMOS transistor 14 is interposed between the primary and secondary CMOS circuits 11 and 12 and the ground. When a control signal CE (chip enable signal) is given to a control input terminal CT in a stand-by mode, a switching NMOS transistor 14 is switched-off to cut a direct current.

The signal amplitude limiter 8 comprises two NMOS transistors with their sources and gates commonly connected between a signal line for transmitting predecoded signals A converted into dual signals in the single-dual converter 7 and their inverted signals AN to the receiving circuit, that is, a predecoded signal line $3a_1$ for transmitting output signals from the primary CMOS circuit 11, and a predecoded signal line $3a_2$ for transmitting output signals from the secondary CMOS circuit 12.

With this construction, the predecoded signals A and AN output from the single-duel converter 7 is limited in amplitude to, for example, 1/10.

The predecoded signals A and AN output from the transmission circuit 5 are transmitted to the receiving circuit 6 through the predecoded signal lines 3a to 3n. Since the predecoded signal A is dual in this embodiment, paired cables $3a_1$, $3a_2$ to $3n_1$, $3n_2$ are each used for predecoded signal lines 3a to 3n.

Figure 4:
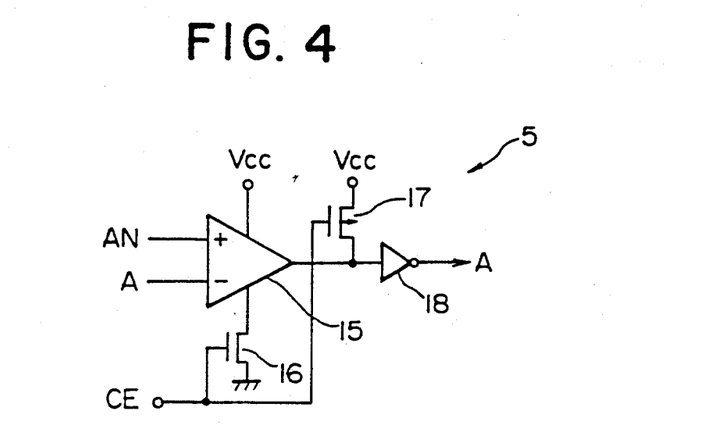
FIG. 4 is a construction view showing a receiving circuit according to the present invention.

The receiving circuit 6 as shown in the circuit diagram of FIG. 4 has a differential amplifier circuit 15 provided each for the signal lines $3a_1$, $3a_2$ to $3n_1$, $3n_2$ and receives the inverted predecoded signal AN transmitted to its non-inverted input terminal (+) and the non-inverted predecoded signal A to its inverted input terminal (−).

The output signal from the differential amplifier circuit 15 is output through the invertor 18, to thereby induce out the non-inverted predecoded signal A from the receiving circuit 6 to the main decoder 4.

The differential amplifier circuit 15 has a switching transistor 16 between its (−) input terminal and the ground and has an electric potential fixing transistor 17 between its output terminal and a positive power source Vcc. These transistors 16 and 17 have their respective gates transmitted with the control signal CE in a stand by mode. Consequently, in a stand-by mode, a direct current is prevented from flowing into the differential amplifier circuit 15 and also its output potential is fixed.

The semiconductor memory device of the present invention thus transmits the predecoded signal A output from the predecoder 2 to the main decoder 4. Accordingly, the signal on the predecoded lines $3a_1$, $3a_2$ to $3n_1$, $3n_2$ presents a dual waveform shown as the signal A and its inverted signal AN in FIG. 5, with its amplitude 6 greatly reduced. Incidentally, the conventional circuit with signals (a) and (aN) as shown in FIG. 5 has its amplitude Vcc equal to a power source voltage.

Figure 5:
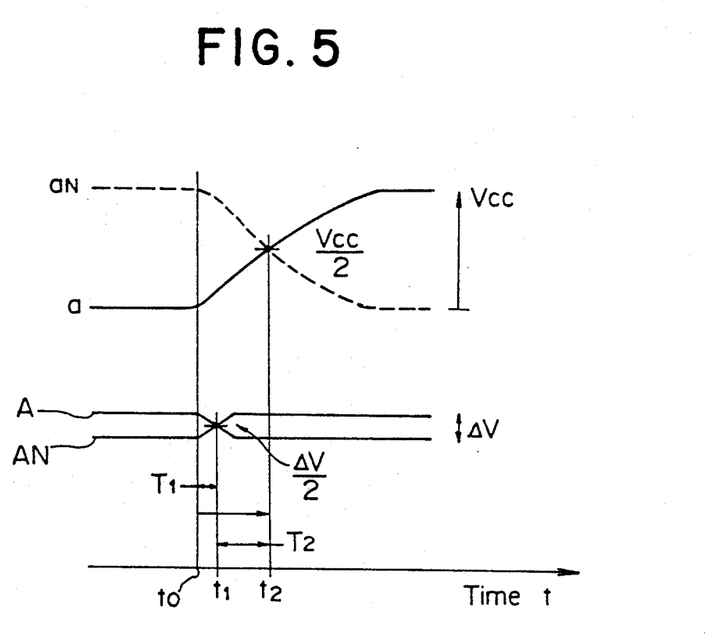
FIG. 5 is a view showing a functional waveform of address bus signals.

As be apparent from FIG. 5, when the electric potential to detect the signal transmission is half the amplitude of the signals, signals in this semiconductor memory device reach their detection potential at a point $t_1$ immediately after a point $t_0$, thus effecting the signal detection rapidly.

In the conventional circuit, however, signals rise to their detection potential at a point $t_2$ only after a certain lapse of time after they start fluctuating in their electric potential. When the delay time $\tau_1$ in the conventional circuit and the delay time $\tau_2$ in this semiconductor memory device are compared, it is clear that the present invention can improve the delay time approximately 10 folds.

The reason will be explained below concretely.

The delay time $\tau$ is defined as:

$$\tau = C \cdot V / I \tag{1}$$

Assuming that the capacity C and the electric current I are constant, the delay time $\tau_1$ in the conventional circuit and the delay time $\tau_2$ in the present circuit would be calculated in the following procedure:

Letting the electric potential to detect the signal transmission be half the amplitude of the signal, the signal detection potential $V_1$ in the conventional circuit is Vcc/2 and the signal detection potential $V_2$ in the present circuit is $\Delta V/2$.

Accordingly, letting the amplitude in the conventional circuit be Vcc=5 V and the amplitude in the present circuit be $\Delta V$=0.5 V, the signal potentials $V_1$ and $V_2$ are $V_1$=2.5 and $V_2$=0.25, respectively. The delay time $\tau_1$ in the conventional circuit can be thus calculated as:

$$\tau_1 = 2.5 \cdot C / I \tag{2}$$

and the delay time $\tau_2$ in the present circuit as:

$$\tau_2 = 0.25 \cdot C / I \tag{3}$$

Accordingly, a delay time ratio between in the present and the conventional circuits can be calculated as:

$$\tau_1 / \tau_2 = 0.25 / 2.5 = 0.1 \tag{4}$$

Thus it is clear that the present circuit can shorten the delay time to 10 percent as compared with the conventional circuit.

When the amplitude $V_{CC}$ is 3.3 V and the detection potential $V_3 = 1.65$ V, a similar comparison can be made with the delay time $\tau_3$:

$$\tau_1/\tau_3 = 0.25/1.65 = 0.15 \quad (5)$$

Thus, it is clear that the delay time in the semiconductor memory device of the present circuit can be as short as 15 percent.

Figure 6:
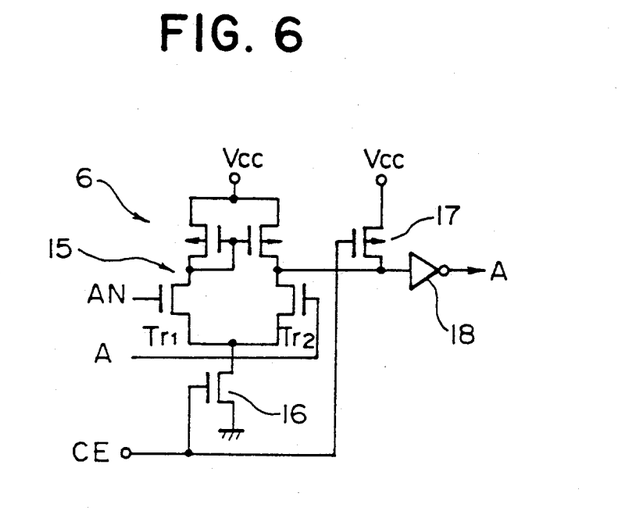
FIG. 6 is a circuit diagram showing a receiving circuit according to the present invention.

The receiving circuit 6, as shown in FIG. 4 and in more detail shown in FIG. 6, is composed of a differential amplifier circuit 15 having MOS transistors $Tr_1$ and $Tr_2$ are differentially connected to each other.

Figure 7:
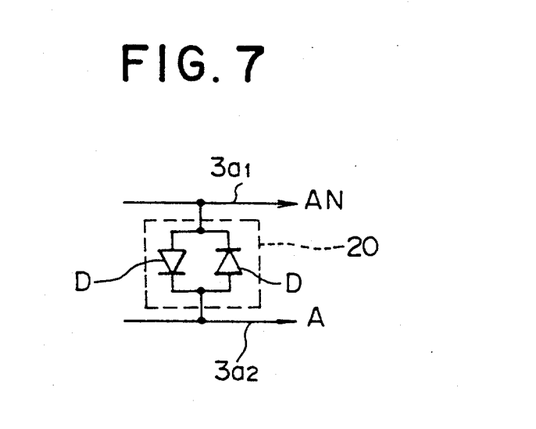
FIG. 7 is a circuit diagram showing a limiter circuit constituting the signal transmission circuit shown in FIG. 3.

Incidentally, the receiving circuits 5 and 6 are not limited to those shown in this embodiments and may be expanded to various kinds of other circuits. For example, the limiter circuit constituting a signal amplitude limit portion 8 may be composed of a limiter circuit 20 having diodes D connected in parallel to each other, as shown in FIG. 7.

Figure 8:
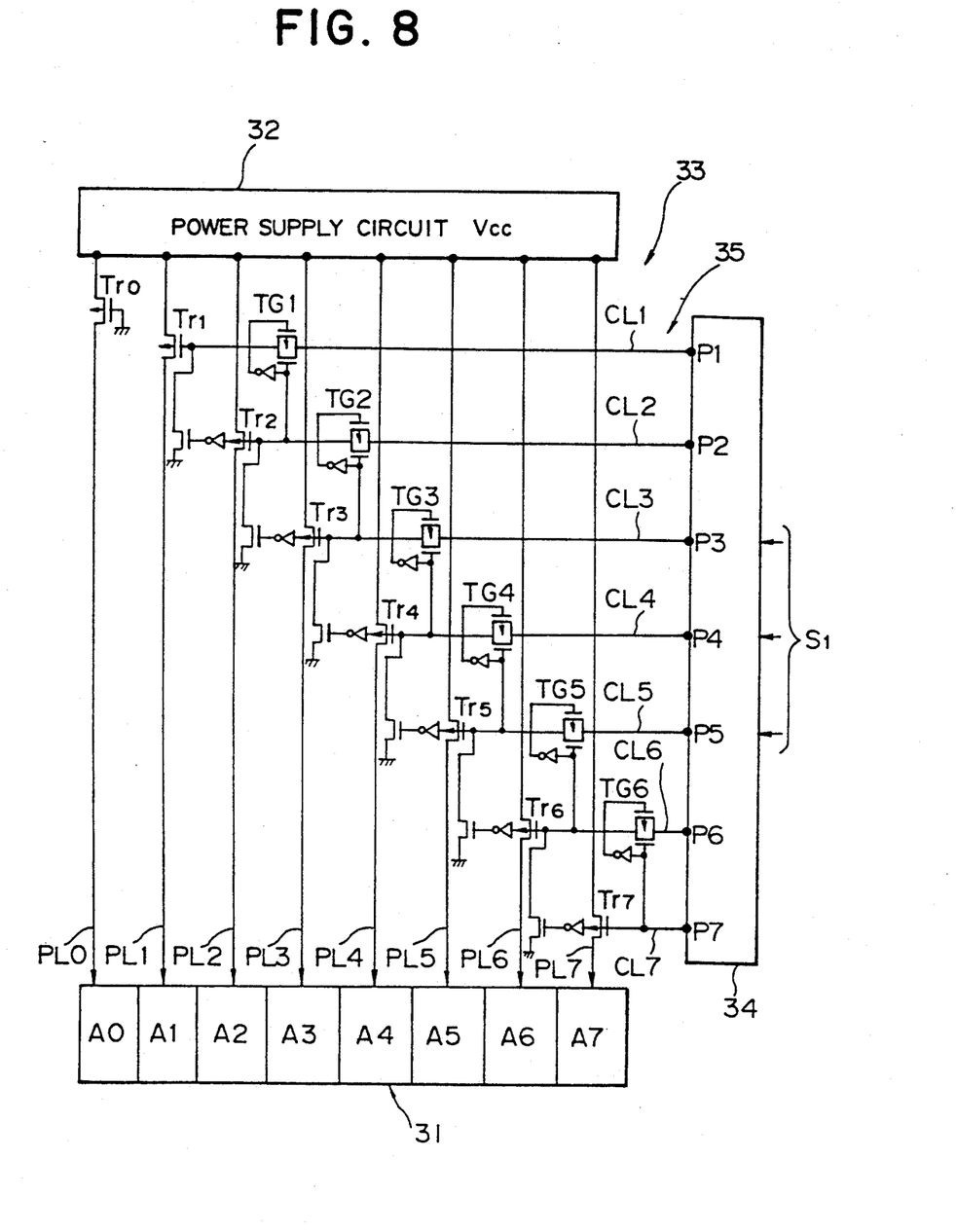
FIG. 8 is a construction view showing a power supply control circuit according to the present invention.

FIG. 8 is a construction view of the main portion of the semiconductor memory device of the present invention, showing the power supply control circuit. As clear from FIG. 8, the semiconductor memory device according to the present invention comprises a memory cell 31, a power supply circuit 32 and a power supply destination allocation circuit 32.

The memory cell 31 can be divided into plural blocks of memory areas for activation, through a memory block dividing system as generally employed for SRAM.

In the present invention, the memory cell array 31 is divided into eight blocks, that is, unit memory cell arrays $A_0$ to $A_7$ which are designated and activated with three-bit control signal $S_1$.

This three-bit control signal $S_1$ is transmitted into a three bit decoder 34 provided in the power supply destination allocation circuit 33. A three-bit decoder 34 activates the specified number of memory cell arrays based on the input three-bit control signal $S_1$.

Specifically, to activate the specified number of memory cell arrays, a voltage at either of output terminals $P_1$ to $P_7$ is made into a level "C" according to the number of the blocks to be activated.

Figure 9:
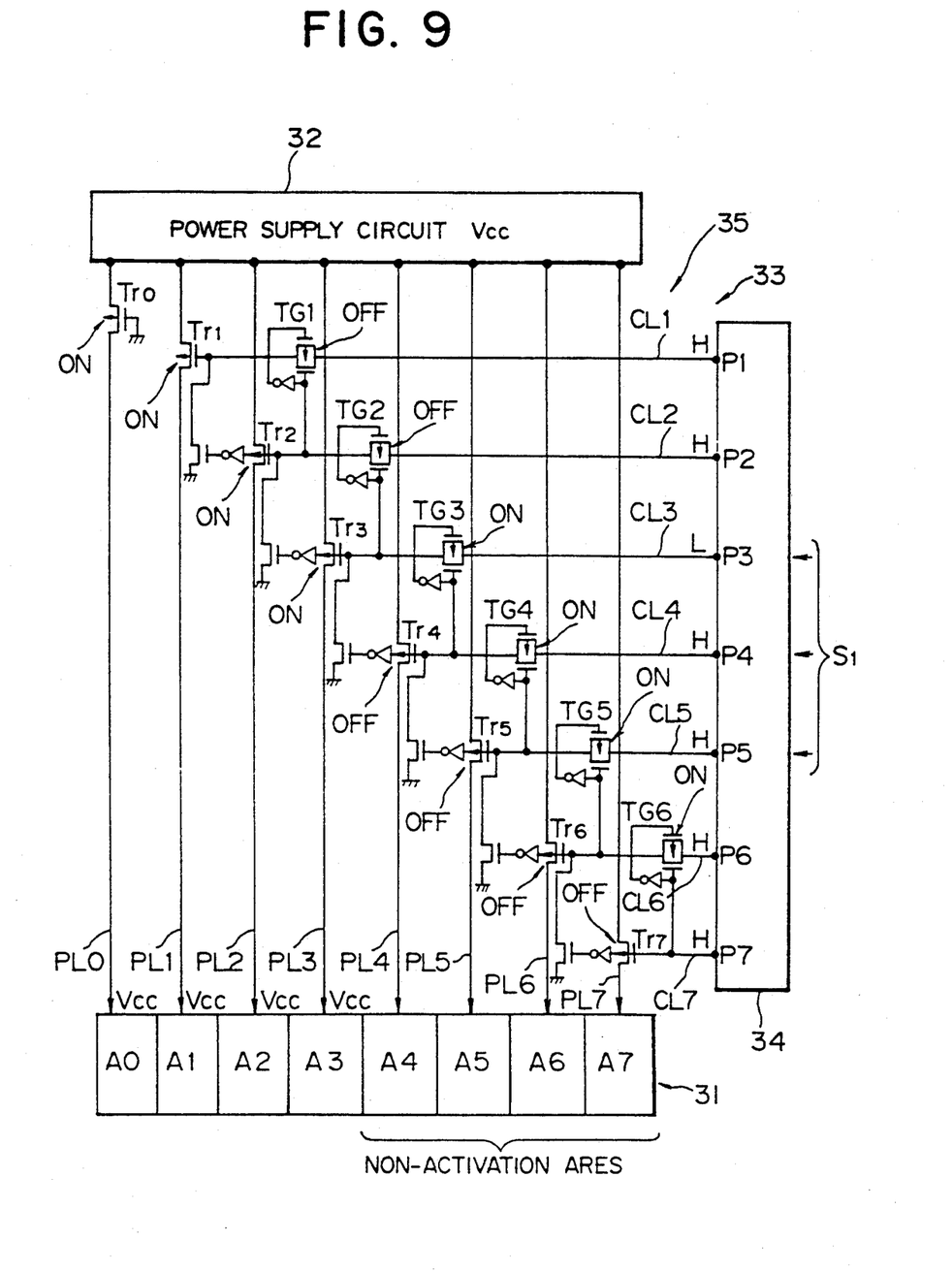
FIG. 9 is a functional view showing the power supply control circuit shown in FIG. 8.

To activate four blocks, as shown in FIG. 9, only the third terminal $P_3$ is made at the level "L" with other terminals, $P_1$, $P_2$ and $P_4$ to $P_7$ left at a level "H".

The output terminals $P_1$ to $P_7$ of the three-bit decoder 34 are respectively connected with control signal lines $CL_1$ to $CL_7$ of a power supply circuit network 35 for feeding the stand-by current supplied from the power supply circuit 32 individually to the unit memory cell arrays $A_0$ to $A_7$.

The power supply lines $PL_0$ to $PL_7$ are provided between the power supply circuit 32 and the unit memory cell arrays $A_0$ to $A_7$, respectively. Switching transistors $Tr_0$ to $Tr_7$ are interposed between these power supply lines $PR_0$ to $PL_7$, respectively. These switching transistors $Tr_0$ to $Tr_7$ are composed of MOS transistors for connecting their gates respectively connected to the output terminals $P_1$ to $P_7$ with the control signal lines $CL_1$ to $CL_7$.

Transfer gates $TG_1$ to $TG_6$ are interposed between these control signal lines $CL_1$ to $CL_7$ and are switched on or off in correspondence to an electric potential at the output terminals $P_1$ to $P_7$, thus switching on or off the switching transistors $Tr_1$ to $Tr_7$ corresponding to the unit memory cell arrays $A_0$ to $A_7$ to be activated. The stand-by current is allowed to flow by supplying the electric power to the blocks of the selected unit memory cell arrays $A_0$ to $A_7$. NMOS transistors are interposed between the gates of the switching transistors $Tr_1$ to $Tr_6$ and the ground, respectively. The gates of NMOS transistors are applied with the electric potentials inverted from those at the output terminals $P_2$ to $P_7$, respectively.

When an electric potential is set up at each of the output terminals $P_1$ to $P_7$ of the three bit decoder 34 as shown in FIG. 9, transfer gates $TG_1$ and $TG_2$ respectively connected with the output terminals $P_1$ and $P_2$ are switched off while transfer gates $TG_3$ to $TG_7$ respectively connected with the output terminals $P_3$ to $P_7$ are switched on. With this set up, the H-level voltage at the output terminals $P_4$ to $P_7$ is applied to the gates of PMOS transistors $Tr_4$ to $Tr_7$ interposed in lines $PL_4$ to $PL_7$ for supplying electric power to the cell arrays $A_4$ to $A_7$, thus switching off these PMOS transistor $Tr_4$ to $Tr_7$.

Meanwhile, with the L-level voltage at the output terminal $P_3$, the switching transistor $Tr_3$ interposed in a line $PL_3$ for supplying electric power to the cell array $A_3$ is switched on, thereby supplying the electric power $V_{cc}$ from the power supply circuit 32 to the cell array $A_3$, which allows a stand-by current to flow therein.

In this case, the switching transistors $Tr_1$ and $Tr_2$ for the cell arrays $A_1$ and $A_2$ are further switched on, thereby supplying electric power $V_{CC}$ to the cell arrays $A_1$ and $A_2$ for activation.

Since the cell array $A_4$ to $A_7$ are not applied with the electric power Vcc, and therefore, are not allowed to be activated. The cell array $A_0$ is always used and the transistor $Tr_0$ for the cell array is always kept ON.

As described above, the memory cell arrays of a semiconductor memory device of the present invention divides the memory area to be activated into plural memory areas through a block dividing system usually employed in SRAM. Accordingly, to select memory cells as desired, the present invention provides three decoders, each for a line address, a column address and a block address.

Figure 10:
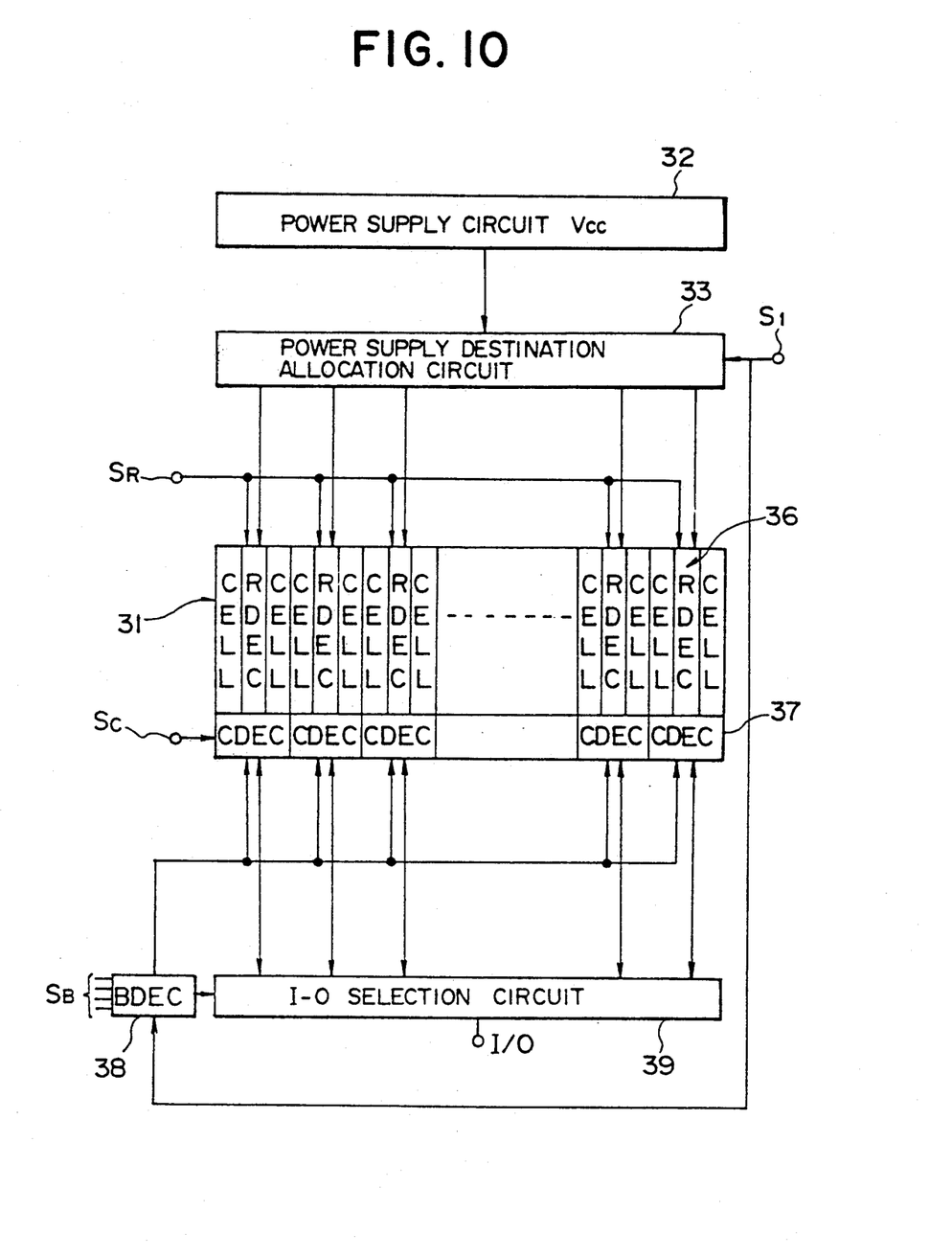
FIG. 10 is a schematic view showing the power supply control circuit.

As shown in FIG. 10, the semiconductor memory device has a row decoder 36, a column decoder 37 and a block decoder 38, for line address signal $S_R$, column address $S_C$ and block address signal $S_B$, respectively.

The block decoder 38 is provided to generate signal to activate blocks within a pre-allocated zone and, together with control signal $S_1$, feeds the activation signal to the column decoder 37 and an I/O selection circuit 39.

In this embodiment, there is described such an example that stand-by current is reduced by preventing electric power from being supplied to its non-use memory areas. However, if the decoder corresponding to the memory area not to be used is not allowed to receive the electric power, the operating current can be reduced, thus further reducing the power consumption.

In the semiconductor memory device described above, its memory area is divided into eight blocks of memory cell arrays. It is, however, needless to say that the number of memory cell arrays can be any number. Its memory area may be divided into, for instance, 16, 32, 64 and 128.

We claim:

1. A semiconductor memory device including an address decode signal transmission circuit comprising:
   address buffers;

a predecoder;

a main decoder;

address buses provided before the main decoder;

a transmission circuit for outputting predecoded signals to said address buses and having voltage limiters comprising two diodes connected between complimentary signal lines; and a receiving circuit provided before said main decoder for differentially amplifying signals from said address buses, said diodes being bidirectionally connected between said complimentary signal lines.

* * * * *